(12) United States Patent
Fulkerson

(10) Patent No.: US 6,563,342 B1
(45) Date of Patent: May 13, 2003

(54) CMOS ECL OUTPUT BUFFER

(75) Inventor: David E. Fulkerson, Chanhassen, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/027,167

(22) Filed: Dec. 20, 2001

(51) Int. Cl.$^7$ .................. H03K 19/0175; H03K 19/094
(52) U.S. Cl. .......................................... 326/73; 326/74
(58) Field of Search ............................... 326/69, 73, 74

(56) References Cited

U.S. PATENT DOCUMENTS 5,089,723 A * 2/1992 Davis et al. ................ 307/451
5,874,837 A * 2/1999 Manohar et al. ............... 326/83
6,424,217 B1 * 7/2002 Kwong ......................... 330/253

* cited by examiner

Primary Examiner—Daniel Chang
(74) Attorney, Agent, or Firm—Schiff Hardin & Waite

(57) ABSTRACT

An CMOS ECL output buffer has a CMOS differential amplifier. A CMOS reference circuit supplies a reference to a reference input of the CMOS differential amplifier. The reference has a high-state value suitable for use by ECL. A CMOS feedback circuit couples a buffer output as negative feedback to a feedback input of the CMOS differential amplifier. A CMOS output circuit supplies an output of the CMOS differential amplifier as the buffer output in response to an input. The buffer output is provided to the ECL. Accordingly, the buffer output is low when the input is low, and the buffer output has the high-state value when the input is high.

35 Claims, 1 Drawing Sheet

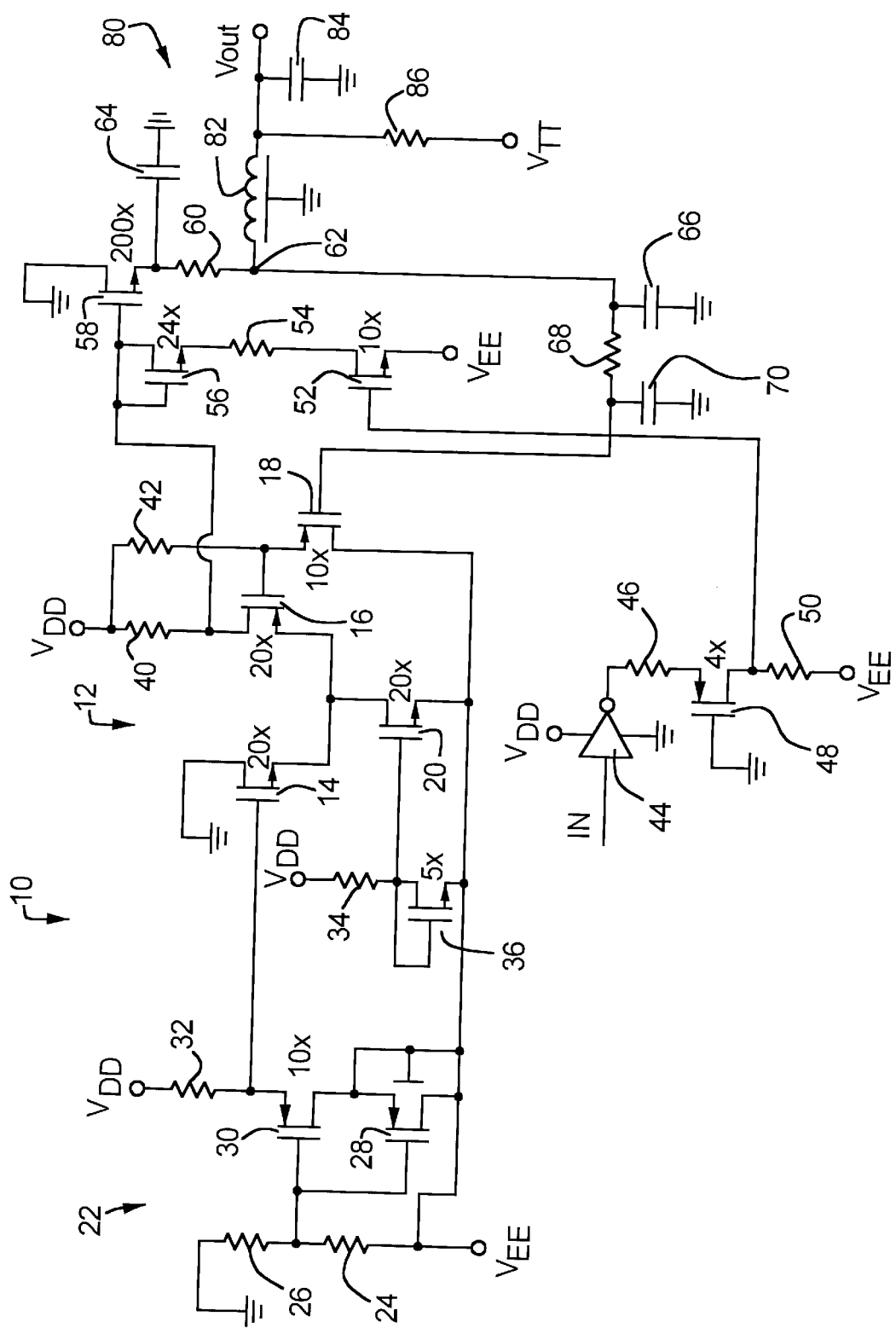

CMOS ECL OUTPUT BUFFER

The U.S. Government may have a paid-up license in this invention and the right in limited circumstances to require the patent owner to license others on reasonable terms as provided for by the terms of a sub-contract with Raytheon having contract number V7-6T0189S.

TECHNICAL FIELD OF THE INVENTION

The present invention relates to a CMOS buffer that can be used to couple signals to ECL (emitter coupled logic).

BACKGROUND OF THE INVENTION

An output buffer of an integrated circuit is generally used to transfer signals from the integrated circuit to an output of the integrated circuit, although an output buffer may also include an entire integrated circuit dedicated solely to driving-signal lines. The output of the integrated circuit may be coupled to various wires, cables or traces that may be generally described as electrical transmission lines, especially when the output buffer is driving electrical signals with fast edge rates. In addition, such transmission lines may be coupled to the input terminals of other integrated circuits. In the context of digital signal communications, the varying electrical characteristics of the transmission line, as well as of the downstream circuits supplied by the output buffer, give rise to a number of problems.

For example, ECL typically uses bipolar transistor technology rather than CMOS technology. Therefore, ECL specifications are usually written around bipolar capabilities. While CMOS integrated circuits typically operate with a power supply of 5 V or 3.3 V, ECL traditionally operates with a negative power supply (such as −5 V). Transistors operating at this large negative voltage are less tolerant of total dose radiation. Also, normal ECL output buffer specifications require a low input resistance, whereas CMOS circuits usually operate at higher resistances. Thus, standard ECL is not generally compatible with CMOS circuits. Accordingly, driving an ECL circuit from a CMOS circuit presents difficult design issues.

The present invention is directed to a buffer employing a feedback amplifier that compares the output voltage of the buffer to a desired on-chip reference voltage in order to drive the output high-state voltage of the buffer to a desired level. The feedback amplifier allows the buffer to accurately meet the high-state voltage and output resistance requirements of an ECL circuit.

SUMMARY OF THE INVENTION

In accordance with one aspect of the present invention, a CMOS ECL output buffer has a buffer input and a buffer output, and the buffer output is arranged to provide an output signal to an ECL circuit in response to an input signal on the buffer input. The CMOS ECL output buffer comprises a CMOS differential feedback amplifier, a CMOS output circuit, and a negative feedback circuit. The CMOS differential feedback amplifier has a reference input, a feedback input, and an output. The reference input is held at a high-state reference voltage suitable for use as a high state voltage by the ECL circuit. The CMOS output circuit is coupled between the output of the CMOS differential feedback amplifier and the buffer output. The negative feedback circuit is coupled between the buffer output and the feedback input of the CMOS differential feedback amplifier. The output signal has a high state and a low state, and the high-state is at about the high-state reference voltage.

In accordance with another aspect of the present invention, a method of buffering a signal supplied to ECL comprises the following: providing a reference to a CMOS differential amplifier, wherein the reference has a level compatible with an upper voltage of the ECL; controlling the signal supplied to the ECL in response to the CMOS differential amplifier and in response to an input signal; and, providing negative feedback to the CMOS differential amplifier based upon the output signal, wherein the negative feedback causes the CMOS differential amplifier to control the signal supplied to the ECL at a level commensurate with the reference.

In accordance with yet another aspect of the present invention, a CMOS ECL output buffer chip comprises a buffer input, a buffer output, a CMOS differential negative feedback amplifier, a CMOS reference circuit, a CMOS feedback circuit, a CMOS output circuit, and a CMOS input circuit. The buffer input receives an input signal. The buffer output provides an output signal to an ECL circuit. The CMOS differential negative feedback amplifier has a reference input, a feedback input, and an output. The CMOS reference circuit is coupled to the reference input of the differential negative feedback amplifier, and the CMOS reference circuit establishes a high-state reference voltage suitable for use by the ECL circuit. The CMOS feedback circuit is coupled between the buffer output and the feedback input of the differential negative feedback amplifier. The CMOS output circuit is coupled between the output of the CMOS differential negative feedback amplifier and the buffer output. The CMOS input circuit is coupled between the buffer input and the CMOS output circuit. Accordingly, the output signal is low when the input signal is low, and the output signal is at about the high-state reference voltage when the input signal is high.

BRIEF DESCRIPTION OF THE DRAWINGS

These and other features and advantages will become more apparent from a detailed consideration of the invention when taken in conjunction with the single drawing figure illustrating a CMOS ECL output buffer according to one embodiment of the present invention.

DETAILED DESCRIPTION

A CMOS ECL output buffer 10 according to one embodiment of the present invention uses CMOS transistors and is illustrated in the drawing figure. The CMOS ECL output buffer 10 includes a differential negative feedback amplifier 12 having transistors 14, 16, 18, 20, 28, and 30. The gate of the transistor 14 is coupled to a reference circuit 22 that establishes a desired reference for the differential negative feedback amplifier 12.

The reference circuit 22 includes resistors 24 and 26 coupled in series to form a voltage divider between a source $V_{EE}$ and ground. The source $V_{EE,}$ for example, may be −2.2 V. This voltage, as noted below, is typical for the termination supply voltage of a transmission line used in semiconductor applications. Because the CMOS ECL output buffer 10 does not use the typical large negative ECL power supply (−5 V), the CMOS ECL output buffer 10 is more tolerant of total dose radiation, whereas transistors are more susceptible to total dose radiation when the power supply is larger.

The junction between the resistors 24 and 26 is coupled to the gates of the transistors 28 and 30. A resistor 32 and the source/drain circuits of the transistors 28 and 30 are coupled in series between a source $V_{DD}$ and the source $V_{EE}$. The source $V_{DD}$, for example, may be +3.3 V, a typical supply voltage for a CMOS integrated circuit. The junction between the source/drain circuit of the transistor 30 and the resistor 32 provides the reference voltage to the gate of the transistor 14.

The source/drain circuit of the transistor 14 is coupled between ground and the source/drain circuit of the transistor 20, and the source/drain circuit of the transistor 20 is coupled between the source drain circuit of the transistor 14 and the source $V_{EE}$. A resistor 34 and the source/drain circuit of a transistor 36 are coupled in series between the source $V_{DD}$ and the source $V_{EE}$. The junction between the resistor 34 and the source/drain circuit of the transistor 36 is coupled to the gates of the transistors 20 and 36.

A resistor 40 is coupled between the source $V_{DD}$ and the source/drain circuit of the transistor 16, and the source/drain circuit of the transistor 16 is coupled through the source/drain circuit of the transistor 20 to the source $V_{EE}$. Accordingly, the transistor 20 acts as a current source for the transistors 14 and 16.

A resistor 42 is coupled between the source $V_{DD}$ and the gate of the transistor 16. The junction between the resistor 42 and the gate of the transistor 16 is coupled through the source/drain circuit of the transistor 18 to the source $V_{EE}$.

An input IN of the CMOS ECL output buffer 10 is coupled to the source $V_{EE}$ through a series circuit including an inverter 44, a resistor 46, the source/drain circuit of a transistor 48, and a resistor 50. The gate of the transistor 48 is grounded. The junction between the source/drain circuit of the transistor 48 and the resistor 50 is coupled to the gate of a transistor 52 whose source/drain circuit is coupled between a resistor 54 and the source $V_{EE}$.

The junction between the resistor 40 and the source/drain circuit of the transistor 16 is coupled (i) through the source/drain circuit of a transistor 56 to the resistor 54, (ii) to the gate of the transistor 56, and (iii) to the gate of an output transistor 58. The source/drain circuit of the output transistor 58 is coupled between ground and one side of a resistor 60 whose other side is coupled to a buffer output terminal 62. The junction between the source/drain circuit of the output transistor 58 and the resistor 60 is coupled through a capacitor 64 to ground. The buffer output terminal 62 is coupled through a capacitor 66 to ground, through a resistor 68 to the gate of the transistor 18, and through the resistor 68 and a capacitor 70 to ground. The resistor 60, the capacitor 64, the capacitor 66, the resistor 68, and the capacitor 70 provide electrostatic discharge protection for the CMOS ECL output buffer 10.

The buffer output terminal 62 is coupled to a transmission line 80 that couples the output of the CMOS ECL output buffer 10 to an ECL circuit. The transmission line 80 is represented by an inductor 82, a capacitor 84, and a resistor 86, with the resistor 86 being coupled between a source $V_{TT}$ and a junction between the inductor 82 and the capacitor 84. The source $V_{TT}$, for example, may be −2.2 volts, a typical termination supply voltage for a transmission line in CMOS applications. The transmission line 80 represents, for example, wires, cables, or traces that couple the buffer output terminal 62 to an ECL circuit.

The output transistor 58 is a source follower transistor that acts somewhat analogously to the emitter follower output transistor in a bipolar ECL circuit. The nx nomenclature in the drawing figure indicates that the corresponding transistor has a width that is n times the standard width of 6.8 microns for an n-channel transistor or n times the standard width of 8.6 microns for a p-channel transistor. For example, the 200x nomenclature in the drawing indicates the output transistor 58 has a width that is 200 times the standard width of 6.8 microns for an n-channel transistor or 200 times the standard width of 8.6 microns for a p-channel transistor.

When the signal on the input IN goes high, the gate of the transistor 52 goes low shutting off the transistor 52 as well as the transistor 56. When the transistor 56 shuts off, the output transistor 58 begins increasing the voltage at the buffer output terminal 62, which is fed back to the differential negative feedback amplifier 12 through the transistor 18. The differential negative feedback amplifier 12 turns on when the output voltage at the buffer output terminal 62 matches the reference voltage established by the voltage divider comprising the resistors 24 and 26. The differential negative feedback amplifier 12 holds the output transistor 58 at the point where the output voltage on the buffer output terminal 62 matches the reference voltage.

Accordingly, the resistors 24 and 26 and the differential negative feedback amplifier 12 ensure that the high-state output voltage of the CMOS ECL output buffer 10 accurately meets the input high-state voltage requirements of an ECL circuit.

When the signal on the input IN goes low, the gate of the transistor 52 goes high turning on the transistor 52 as well as the transistor 56. When the transistor 56 turns on, the output transistor 58 decreases the voltage at the buffer output terminal 62, which is fed back to the differential negative feedback amplifier 12 through the transistor 18. The differential negative feedback amplifier 12 turns off when the output voltage at the buffer output terminal 62 falls below the reference voltage established by the voltage divider comprising the resistors 24 and 26. When the differential negative feedback amplifier 12 turns off, the gate of the output transistor 58 is pulled low. Consequently, the voltage at the buffer output terminal 62 is pulled low.

Accordingly, the transistor 56 and the output transistor 58 ensure that the low-state output voltage of the CMOS ECL output buffer 10 accurately meets the input low-state voltage requirements of an ECL circuit. Also, because of the negative feedback provided from the buffer output terminal 62 to the differential negative feedback amplifier 12, the output resistance of the CMOS ECL output buffer 10 is kept lower than the resistance of either the electrostatic discharge protection network comprising the resistor 60, the capacitor 64, the capacitor 66, the resistor 68, and the capacitor 70, or the output transistor 58.

Modifications of the present invention will occur to those practicing in the art of the present invention. Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A CMOS ECL output buffer having a buffer input and a buffer output, wherein the buffer output is arranged to provide an output signal to an ECL circuit in response to an input signal on the buffer input, the CMOS ECL output buffer comprising:
    a CMOS differential feedback amplifier having a reference input, a feedback input, and an output, wherein the reference input is held at a high-state reference voltage suitable for use as a high state voltage by the ECL circuit;
    a CMOS output circuit coupled between the output of the CMOS differential feedback amplifier and the buffer output; and, a negative feedback circuit coupled between the buffer output and the feedback input of the CMOS differential feedback amplifier;

wherein the output signal has a high state and a low state, and wherein the high-state is at about the high-state reference voltage.

2. The CMOS ECL output buffer of claim 1 wherein the CMOS differential feedback amplifier comprises first and second CMOS transistors, wherein a gate of the first CMOS transistor is held at the high-state reference voltage, and wherein a gate of the second CMOS transistor is coupled to the negative feedback circuit.

3. The CMOS ECL output buffer of claim 2 wherein the negative feedback circuit includes a third CMOS transistor coupled between the buffer output and the gate of the second CMOS transistor.

4. The CMOS ECL output buffer of claim 2 wherein the CMOS output circuit includes a third CMOS transistor having a gate coupled to the output of the CMOS differential feedback amplifier and a source/drain circuit coupled to the buffer output.

5. The CMOS ECL output buffer of claim 4 wherein the negative feedback circuit includes a fourth CMOS transistor having a gate coupled to the buffer output and a source/drain circuit coupled to the gate of the second CMOS transistor.

6. The CMOS ECL output buffer of claim 5 further comprising an inverter coupled between the buffer input to the CMOS output circuit.

7. The CMOS ECL output buffer of claim 1 wherein the CMOS output circuit includes a CMOS transistor having a gate coupled to the output of the CMOS differential feedback amplifier and a source/drain circuit coupled to the buffer output.

8. The CMOS ECL output buffer of claim 7 further comprising an inverter circuit coupled between the buffer input and the gate of the CMOS transistor.

9. The CMOS ECL output buffer of claim 8 wherein the CMOS transistor is a first CMOS transistor, and wherein the inverter circuit includes an inverter and second, third, and fourth CMOS transistors coupling the buffer input to the gate of the first CMOS transistor.

10. The CMOS ECL output buffer of claim 1 further comprising a source having a negative potential between −1 and −3 volts.

11. The CMOS ECL output buffer of claim 1 further comprising a source having a negative potential on the order of −2 volts.

12. The CMOS ECL output buffer of claim 1 further comprising a single positive potential source and a single negative potential source, wherein the single positive potential source is about +3 V, and wherein the single negative potential source is about −2 V.

13. A method of buffering a signal supplied to ECL comprising:

providing a reference to a CMOS differential amplifier, wherein the reference has a level compatible with an upper voltage of the ECL;

controlling the signal supplied to the ECL in response to the CMOS differential amplifier and in response to an input signal; and, providing negative feedback to the CMOS differential amplifier based upon the signal, wherein the negative feedback causes the CMOS differential amplifier to control the signal supplied to the ECL at a level commensurate with the reference.

14. The method of claim 13 wherein the providing of a reference comprises providing the reference to the CMOS differential amplifier from a CMOS reference source.

15. The method of claim 14 wherein the CMOS reference source includes a resistor voltage divider.

16. The method of claim 13 wherein the controlling of the signal supplied to the ECL comprises controlling a CMOS transistor in response to the CMOS differential amplifier and in response to an input signal.

17. The method of claim 16 wherein the providing of a reference comprises providing the reference to the CMOS differential amplifier from a CMOS reference source.

18. The method of claim 13 wherein the providing of negative feedback to the CMOS differential amplifier comprises providing negative feedback to the CMOS differential amplifier through a CMOS transistor.

19. The method of claim 18 wherein the CMOS transistor comprises a first CMOS transistor, and wherein the controlling of the signal supplied to the ECL comprises controlling a second CMOS transistor in response to the CMOS differential amplifier and in response to an input signal.

20. The method of claim 18 wherein the providing of a reference comprises providing the reference to the CMOS differential amplifier from a CMOS reference source.

21. The method of claim 20 wherein the CMOS transistor comprises a first CMOS transistor, and wherein the controlling of the signal supplied to the ECL comprises controlling a second CMOS transistor in response to the CMOS differential amplifier and in response to an input signal.

22. The method of claim 13 further comprising supplying the CMOS differential amplifier with a potential of about −2 volts.

23. The method of claim 13 further comprising supplying the CMOS differential amplifier with a potential of between −1 and −3 volts.

24. The method of claim 13 further comprising supplying the CMOS differential amplifier with a single positive potential and a single negative potential, wherein the single positive potential source is about +3 V, and wherein the single negative potential source is about −2 V.

25. A CMOS ECL output buffer chip comprising:

a buffer input arranged to receive an input signal;

a buffer output arranged to provide an output signal to an ECL circuit;

a CMOS differential negative feedback amplifier having a reference input, a feedback input, and an output;

a CMOS reference circuit coupled to the reference input of the differential negative feedback amplifier, wherein the CMOS reference circuit establishes a high-state reference voltage suitable for use by the ECL circuit;

a CMOS feedback circuit coupled between the buffer output and the feedback input of the differential negative feedback amplifier;

a CMOS output circuit coupled between the output of the CMOS differential negative feedback amplifier and the buffer output; and, a CMOS input circuit coupled between the buffer input and the CMOS output circuit, wherein the output signal is low when the input signal is low, and wherein the output signal is at about the high-state reference voltage when the input signal is high.

26. The CMOS ECL output buffer chip of claim 25 wherein the CMOS differential negative feedback amplifier comprises first and second CMOS transistors, wherein a gate of the first CMOS transistor is coupled to the CMOS reference circuit, and wherein a gate of the second CMOS transistor is coupled to the CMOS feedback circuit.

27. The CMOS ECL output buffer chip of claim 26 wherein the CMOS input circuit includes an inverter.

28. The CMOS ECL output buffer chip of claim 26 wherein the CMOS feedback circuit includes a third CMOS transistor coupled between the buffer output and the gate of the second CMOS transistor.

29. The CMOS ECL output buffer chip of claim 26 wherein the CMOS output circuit includes a third CMOS transistor having a gate coupled to the output of the CMOS differential negative feedback amplifier and a source/drain circuit coupled to the buffer output.

30. The CMOS ECL output buffer chip of claim 29 wherein the CMOS feedback circuit includes a fourth CMOS transistor coupled between the buffer output and the gate of the second CMOS transistor.

31. The CMOS ECL output buffer chip of claim 25 wherein the CMOS input circuit includes an inverter.

32. The CMOS ECL output buffer chip of claim 25 wherein the CMOS output circuit includes a CMOS transistor having a gate coupled to the output of the CMOS differential negative feedback amplifier and a source/drain circuit coupled to the buffer output.

33. The CMOS ECL output buffer chip of claim 32 wherein the CMOS input circuit includes an inverter.

34. The CMOS ECL output buffer chip of claim 33 wherein the CMOS transistor is a first CMOS transistor, wherein the CMOS input circuit includes second, third, and fourth CMOS transistors coupled between the inverter and the gate of the first CMOS transistor.

35. The CMOS ECL output buffer chip of claim 25 further comprising a single positive potential source and a single negative potential source, wherein the single positive potential source is about +3 V, and wherein the single negative potential source is about −2 V.

* * * * *